United States Patent
Kunz et al.

[11] Patent Number: 5,616,226
[45] Date of Patent: Apr. 1, 1997

[54] CATHODE ASSEMBLY

[75] Inventors: Hans Kunz, Hasselroth; Andreas Sauer, Aschaffenburg; Manfred Schuhmacher, Alzenau; Joachim Szczyrbowski, Goldbach; Dietmar Marquardt, Erlensee, all of Germany

[73] Assignee: Balzers und Leybold Deutschland Holding AG, Hanau am Main, Germany

[21] Appl. No.: 554,751

[22] Filed: Nov. 7, 1995

[30] Foreign Application Priority Data

Mar. 9, 1995 [DE] Germany ............... 195 08 406.3

[51] Int. Cl.⁶ ............................................. C23C 14/34
[52] U.S. Cl. ..................... 204/298.23; 204/298.19; 204/298.12; 204/298.16; 204/298.26; 204/298.29
[58] Field of Search ............. 204/298.12, 298.16, 204/298.19, 298.2, 298.22, 298.23, 298.29, 298.26

[56] References Cited

U.S. PATENT DOCUMENTS

| 5,292,419 | 3/1989 | Moses et al. | 204/298.29 |
| 5,482,610 | 1/1996 | Wolf et al. | 204/298.19 |

*Primary Examiner*—Nam Nguyen
*Assistant Examiner*—Rodney G. McDonald
*Attorney, Agent, or Firm*—Felfe & Lynch

[57] ABSTRACT

A pair of parallel elongate targets are fixed with respect to respective plates mounted in a vacuum chamber by means of clamps arranged along the longitudinal sides of each target, and an expandable wedge system between the rear plate and magnetic yokes on the backs of the targets. The wedge system for each target includes a wedge block having ramped surfaces which face outward, a pair of wedge jaws having ramped surfaces which slide against the ramped surfaces of the block, and a screw which draws the jaws together against the ramped surfaces of the block to expand the system and force the plate away from the yoke and fix the entire assembly in the clamps.

6 Claims, 5 Drawing Sheets

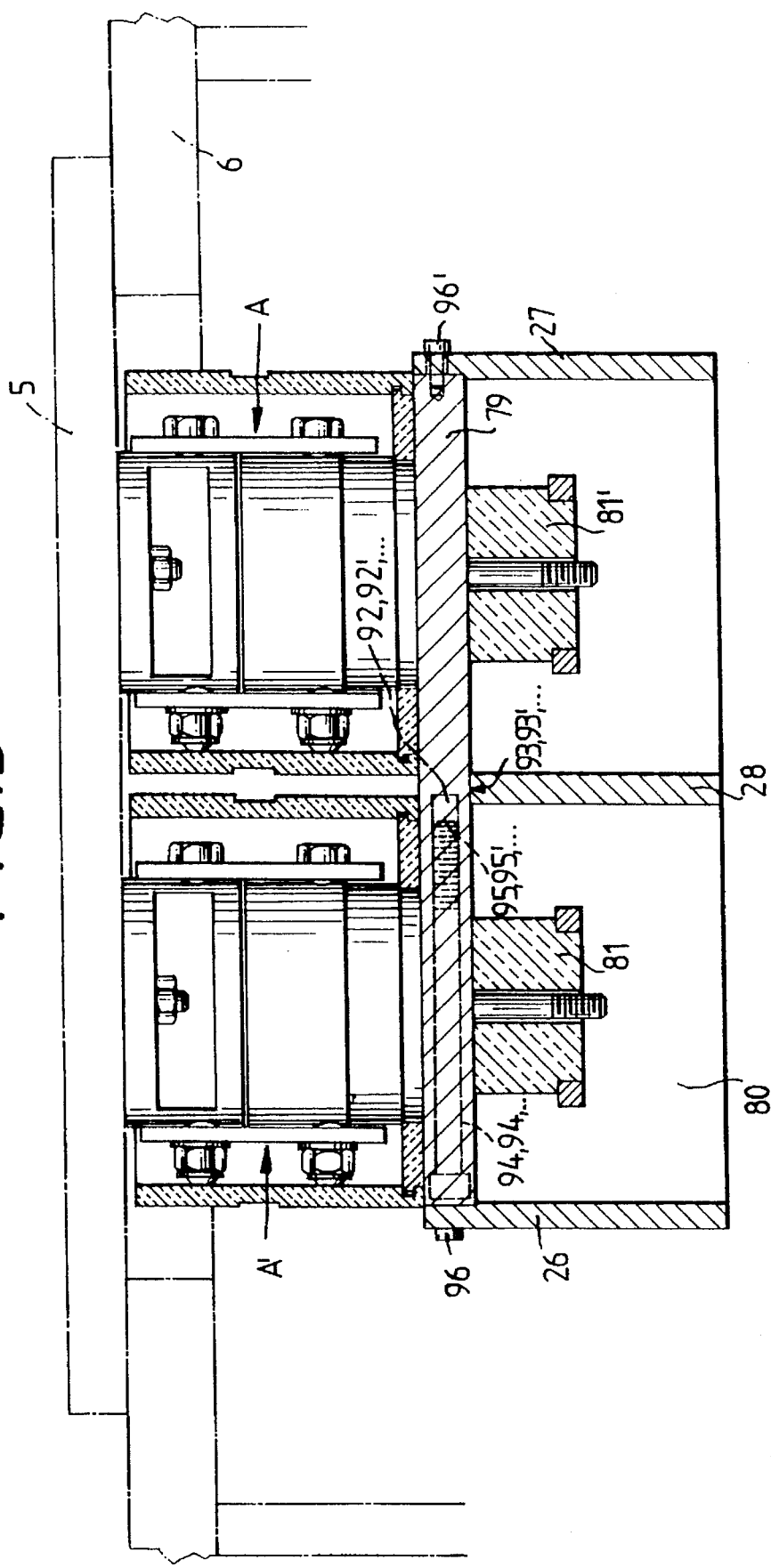

CATHODE ASSEMBLY

BACKGROUND OF THE INVENTION

The invention pertains to a cathode design for a device for sputtering a pair of targets, the device comprising magnetic yokes; targets with narrow, elongated, plate-shaped configurations; permanent magnets installed between the targets and the magnetic yokes; and holders for attaching the magnetic yokes to a section of the wall of the vacuum chamber.

SUMMARY OF THE INVENTION

The present invention is based on the task of creating a twin cathode for sputtering highly insulating materials, that is, a cathode which makes it possible to achieve a high sputtering rate and a stable process. In particular, the goal of the invention is to optimize the cooling of the targets, the replacement of the targets, and the magnetic field configuration.

This goal is accomplished in that the side of each magnetic yoke facing away from the target (which is resting against a shoulder) is provided with a wedge block, and in that the lateral surfaces of the block parallel to the long sides of the yoke are designed as lead-up ramps, which cooperate with lead-up ramps on corresponding wedge jaws. The wedge jaws, which are provided on both sides of each wedge block, can be shifted in opposite directions parallel to the plane of the target by means of tensioning screws. The surfaces of the jaws facing away from the target are supported against a rear plate, which is urged in turn by the force of a spring toward the magnetic yoke.

BRIEF DESCRIPTION OF THE DRAWINGS

FIG. 5 shows a transverse section through the cathode design according to FIG. 1, but with the cathodes removed from the central plate.

DETAILED DESCRIPTION OF THE PREFERRED EMBODIMENT

Figure 1:
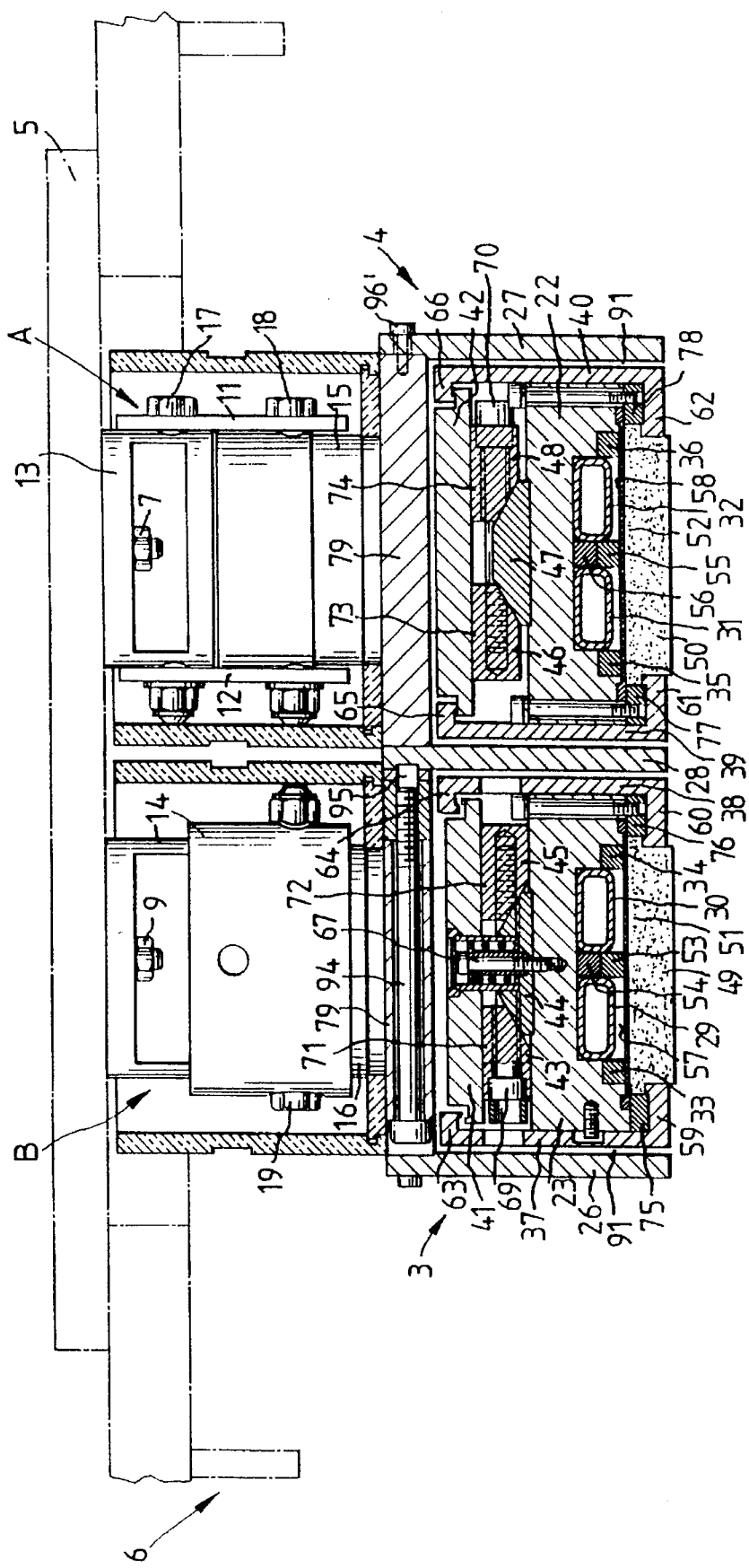
FIG. 1 shows a transverse section through a twin-cathode design according to the invention.
Figure 2:
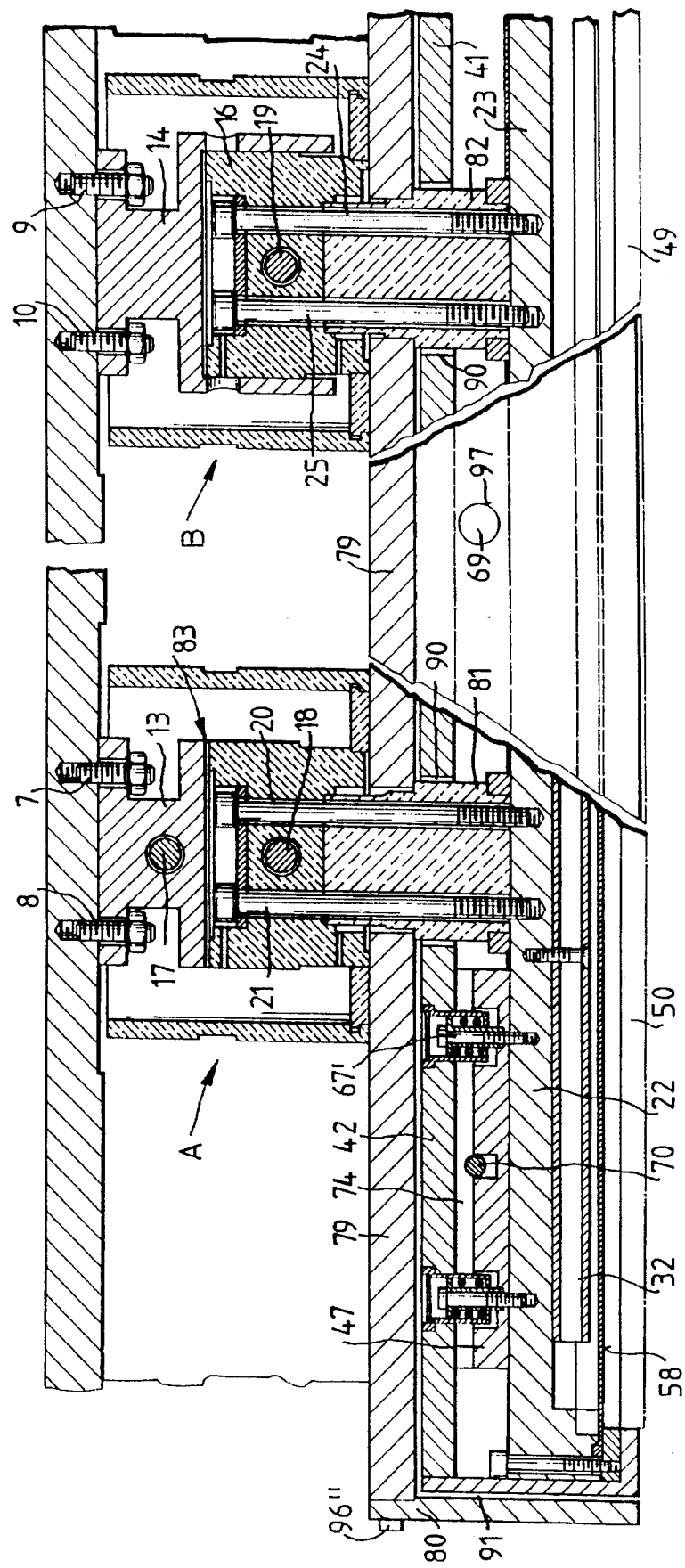
FIG. 2 shows a lengthwise section through the cathode design according to FIG. 1.
Figure 3:
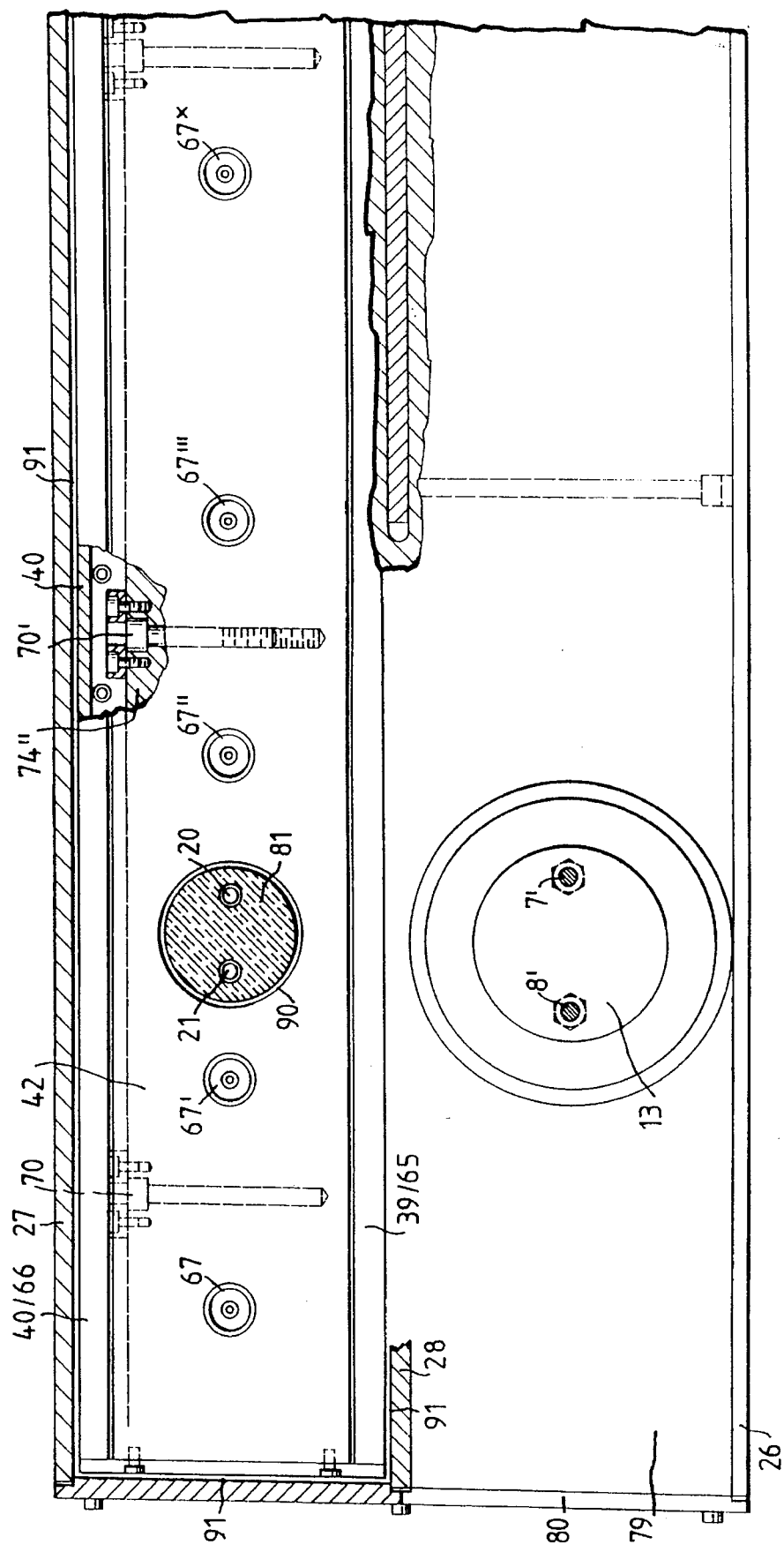
FIG. 3 shows a top view of the twin-cathode design according to FIGS. 1 and 2 in partial cross section.
Figure 4:
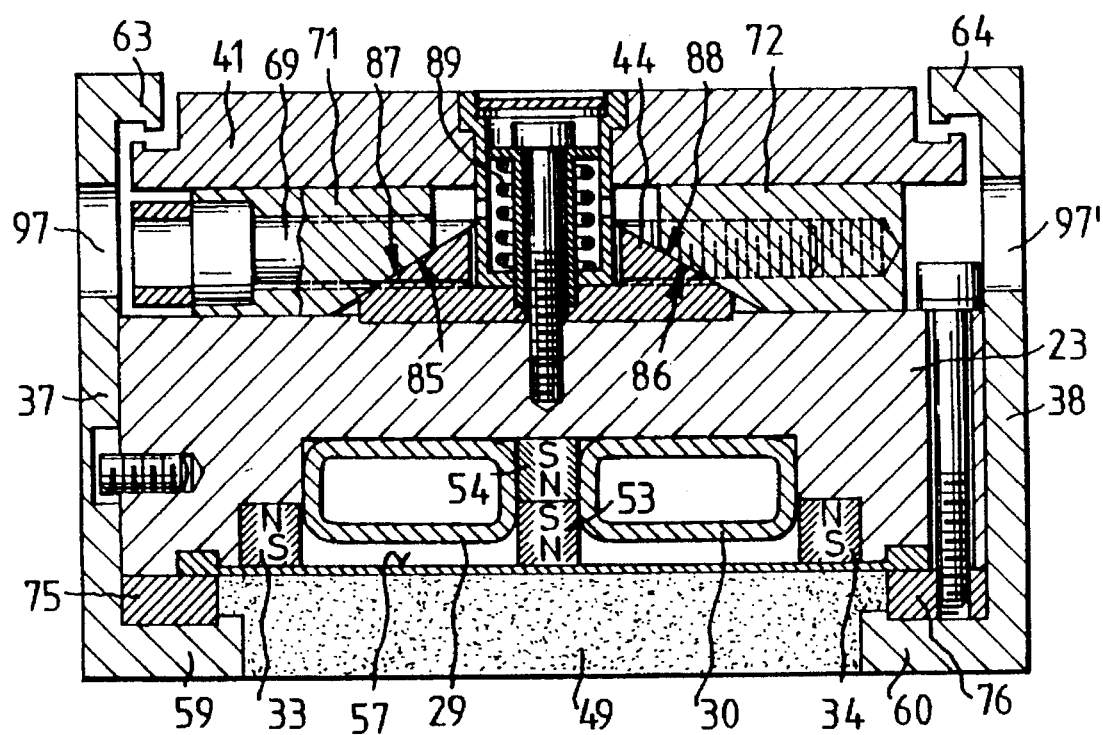
FIG. 4 shows a transverse section through a cathode on an enlarged scale.

As FIGS. 1 and 2 show, the two cathodes 3, 4 are attached to an upper wall section 5 of a vacuum chamber 6 by means of screws 7, 8; 9, 10. Cathodes 3, 4 themselves can be either connected to pillow blocks 13 and insulators 15 indirectly by way of brackets 11, 12, which thus form links in a chain, and screws 17, 18, or connected to pillow blocks 14 directly by screws 19 and insulators 16. Insulators 15, 16 for their part are screwed to magnetic yokes 22, 23 by stud bolts 20, 21; 24, 25, so that cathodes 3, 4, together with their enclosing side plates 26, 27, 28; magnetic yokes 22, 23; cooling tubes 29–33; permanent magnets 33–36; 53–56; clamping bars 37–40; top plates 41, 42; wedge jaws 71–74; wedge blocks 44, 47; and targets 49, 50, by way of their base portions 51, 52, are able to hang from the upper section 5 of the wall.

Targets 49, 50, i.e., their base portions 51, 52, are pressed by clamping bars 37–40 against membranes 57, 58, because ends of the bars facing the substrate are provided with claws which engage base portions 51, 52 and pull them tightly against magnetic yokes 22, 23, for which purpose claws 63–66 at the ends of the bars facing away from the base portions are also designed to engage rear plates 41, 42, each of which is otherwise connected by screws 67, 68 to the magnetic yokes.

To connect targets 49, 50 rigidly to magnetic yokes 22, 23, clamping screws 69, 70, which connect wedge jaws 71, 72; 73, 74 together, are screwed in against blocks 44, 47 until rear plates 41, 42 rest firmly against upper edges 63–66 at the top and lower claws 59–62 rest firmly against spacer bars 75–78 at the bottom, so that all of the parts gripped by clamping bars 37–40 are connected rigidly together. Because pillow blocks 13, 14 are rigidly connected to magnetic yokes 22, 23 by means of screws 20, 21; 24, 25, the yokes are supported by upper wall section 5 of vacuum chamber 6. At the same time, cover plate 79 is supported on insulators 81, 82, which are held in place in turn by screws 20, 21; 24, 25. Because a gap 83 is provided between pillow block 13 and insulator 15, cathodes 3, 4 can execute a certain relative motion in the horizontal plane with respect to the means of suspension shown on the right in FIG. 2 (because insulators 15, 16 are connected to pillow blocks 13, 14 in an articulated manner by way of brackets 11, 12 and screws 17, 18 and therefore act like links in a chain). Cathodes 3, 4 are very long; each of the two long cathodes 3, 4 is attached to upper wall section 5 by several suspension points of type A (shown on the left in FIG. 2), distributed over the length of the cathodes, and by one suspension point of type B (shown on the right in FIG. 2).

As a result of the enclosed design, the cathode body is protected from the accumulation of sputtered-on layers. Claw bars or clamping bars 37–40 hold target 49, 50 and clamp it positively against membranes 57, 58. The rows of clamping bars are multi-part, and because they are attached separately, they allow longitudinal expansion to occur in a controlled manner within a very small gap 90, 91. The side facing the substrate is smooth and prevents local process instabilities, such as arcing in particular.

Because of the elimination of many screws and the ease with which clamping bars 37–40 can be removed, the targets 49, 50 can be replaced quickly.

The interlocking and clamping action is accomplished with wedge blocks 44, 47, which are mounted on the rear of the yokes 22, 23; each of these blocks cooperates with two opposing wedge jaws 71, 72; 73, 74, which are constrained to move only in a certain direction when screws 69, 70 are turned. During locking, the jaws of each pair are moved together against the respective wedge blocks by clockwise turning of screws 69, 70. This in turn moves plates 41, 42 away from respective targets 49, 50, thus locking the plates and targets against clamping bars 37–40. During the unlocking operation, rear plates 41, 42 are moved toward the targets 49, 50 and the clamps 37–40 released by the force of a spring. It is advantageous for the screw to be actuated from the outward-facing side of the cathode. This reduces the danger of damage to the targets during a replacement operation. The possibility of a coating being deposited on the screws is minimized, and easy target replacement is guaranteed.

Cooling water is supplied through a central connection (not shown in detail), which is connected to cathodes 3, 4 in such a way as to prevent HF leakage. A central connection reduces the problems caused by longitudinal expansion and guarantees symmetric HF feed. In cathode 3, 4, the water is conducted in a parallel manner to one end of cathode 3, 4 in a lower-lying plane; after a 180° turn in the lower plane, it is then divided into two parallel channels 29, 30; 31, 32. The water is then returned at the cylindrical connection through a bore parallel to the feed. The advantage of conducting the water in this way is that a seal or partition plate on the central row of magnets can be eliminated. With this cooling water circuit, it is impossible for any capacity-reducing overflows to occur (as occur in the case of counter-current, differential pressure systems).

The distance separating magnets 33–36 and 53–56 from the top surface of the target is minimized. This results in a high field strength over the target. Outer magnets 33, 34; 35, 36 rest with two sides against the cathode body, as a result of which the field outside the sputter pit is reduced to a minimum and a high degree of process stability is achieved.

Each of the central rows of magnets 53 54; 55, 56 rests with one side on the cathode body. Thus the conventional separate magnetic yokes are eliminated.

The geometric arrangement of the magnets is fixed. The magnetic material consists preferably of Vacodyn. The component of the magnetic field parallel to the front of the target is greater than 10 KA/m, preferably around 30 KA/m.

Target 49, 50 projects about 2 mm outward beyond claw bars 37–40, as a result of which the claw bars are protected from being sputtered as well. The sputter pit extends as far as the outer clamping bars 37, 38; 39, 40, as a result of which the conversion of Si to $SiO_z$ (or of metal to metal oxides) on the surface of the target is avoided. The sputtering process becomes more stable as a result, and the quality of the layers is better.

What is claimed is:

1. A cathode assembly for sputtering a target, said assembly comprising magnetic yoke means, target means on one side of said yoke means, plate means on the other side of said yoke means, clamping means effective to limit movement of said plate means away from said target means, and wedge means between said yoke means and said plate means, said wedge means being expandable to move said plate means away from said yoke means, whereby said plate means and said target means can be fixed against said clamping means.

2. A cathode assembly as in claim 1 wherein said wedge means comprises a wedge block having a ramped surface, a wedge jaw having a ramped surface, and screw means effective to move said ramped surface of said wedge jaw against said ramped surface of said wedge block, thereby expanding said wedge means to move said plate means away from said target means.

3. A cathode assembly as in claim 2 wherein said wedge means comprises two said wedge jaws for each said wedge block, said wedge block having two said ramped surfaces, said screw means being effective to move said wedge jaws toward each other in order to expand said wedge means.

4. A cathode assembly as in claim 1 wherein said clamping means comprises a pair of opposed clamping bars, each bar having rear claw means borne against by said plate means and front claw means borne against by said target means.

5. A cathode assembly as in claim 1 further comprising tension spring means effective to urge said plate means toward said yoke means, said wedge means further being contractible, whereby said plate means moves toward said yoke means when said wedge means is contracted.

6. A cathode assembly as in claim 1 wherein said target means comprises a pair of elongate targets in parallel, each said target having associated therewith said magnetic yoke means, said plate means, said clamping means, and said wedge means.

* * * * *